United States Patent [19]

Gabuzda et al.

[11] Patent Number: 4,851,965
[45] Date of Patent: Jul. 25, 1989

[54] DIRECTED AIR MANAGEMENT SYSTEM FOR COOLING MULTIPLE HEAT SINKS

[75] Inventors: Paul G. Gabuzda, Laguna Beach; Sanford V. Terrell, Laguna Hills, both of Calif.

[73] Assignee: Unisys Corporation, Blue Bell, Pa.

[21] Appl. No.: 198,631

[22] Filed: May 23, 1988

Related U.S. Application Data

[63] Continuation-in-part of Ser. No. 23,359, Mar. 9, 1987, abandoned.

[51] Int. Cl.$^4$ ............................................. H05K 7/20
[52] U.S. Cl. .................................... 361/383; 165/908; 361/415
[58] Field of Search ................. 165/908, 185, 104, 34; 174/16 R, 16 H, 16 S, 16.1, 16.3; 62/418; 357/81; 361/382–386, 415

[56] References Cited

U.S. PATENT DOCUMENTS

| | | | |
|---|---|---|---|
| 2,445,582 | 7/1948 | Melville | 361/384 |
| 3,387,648 | 6/1968 | Ward, Jr. | 165/104.34 |
| 3,626,251 | 12/1971 | Vigue | 361/384 |
| 3,843,910 | 10/1974 | Ringuet | 165/104.34 |
| 4,233,644 | 11/1980 | Hwang | 361/384 |
| 4,277,816 | 7/1981 | Dunn | 361/384 |
| 4,498,118 | 2/1985 | Bell | 165/908 |
| 4,674,004 | 6/1987 | Smith | 165/908 |
| 4,715,438 | 12/1987 | Gabuzda | 174/16 HS |

Primary Examiner—Gerald P. Tolin
Attorney, Agent, or Firm—Alfred W. Kozak; Nathan Cass; Robert S. Bramson

[57] ABSTRACT

An enclosed mini-plenum is inserted between printed circuit boards to direct cooling air of various amounts into selected areas of the printed circuit board. The mini-plenum provides orifices of varying sizes to direct amounts of cooling airflow to aligned heat sinks on the printed circuit board. Certain orifices may have raised foils or leaves which can further direct selected amounts of airflow through the orifices. This system provides specifically controlled amounts of cooling facilities to printed circuit board areas having different heat dissipation requirements.

2 Claims, 5 Drawing Sheets

U.S. Patent   Jul. 25, 1989   Sheet 1 of 5   4,851,965
_Fig.1_
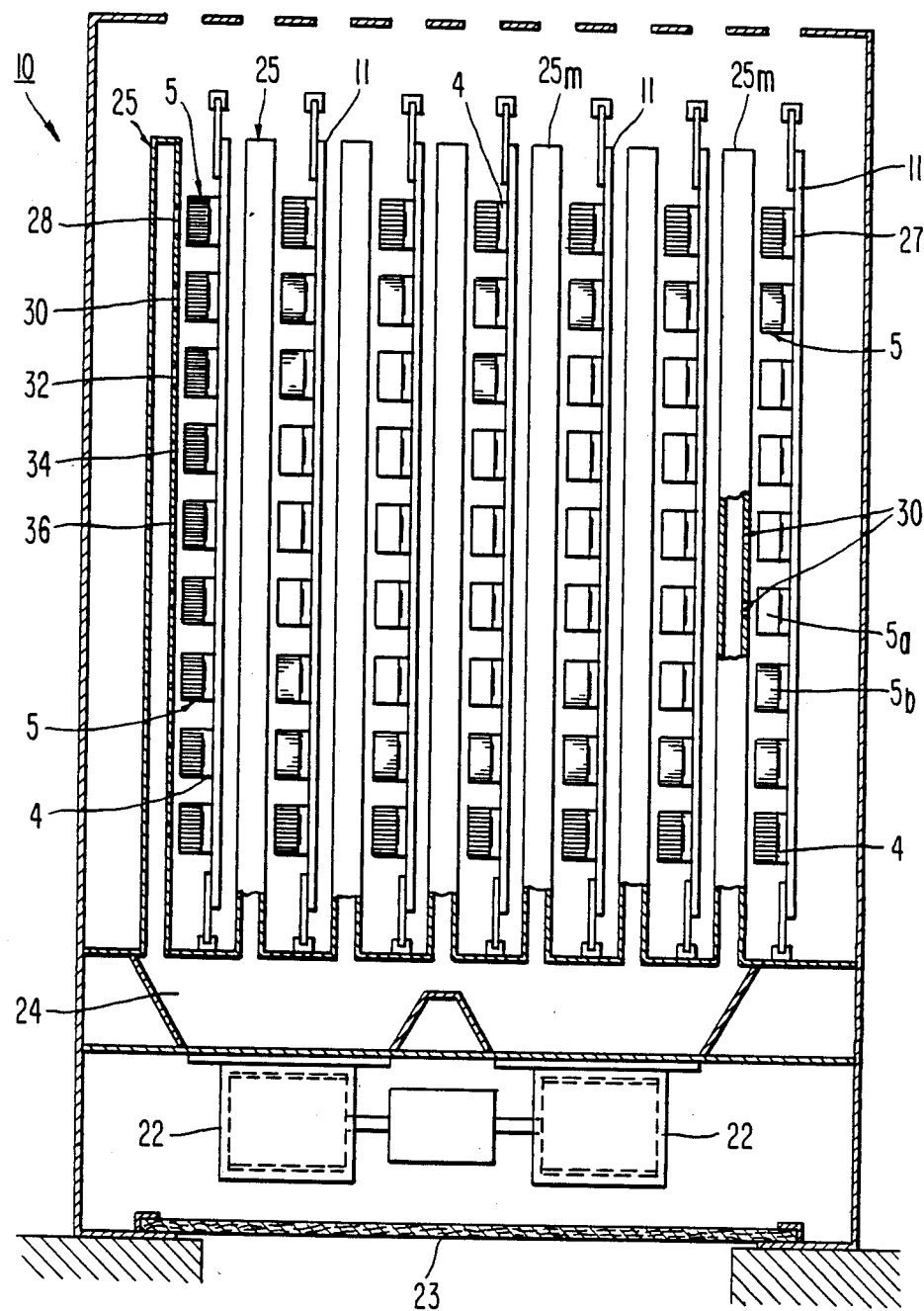

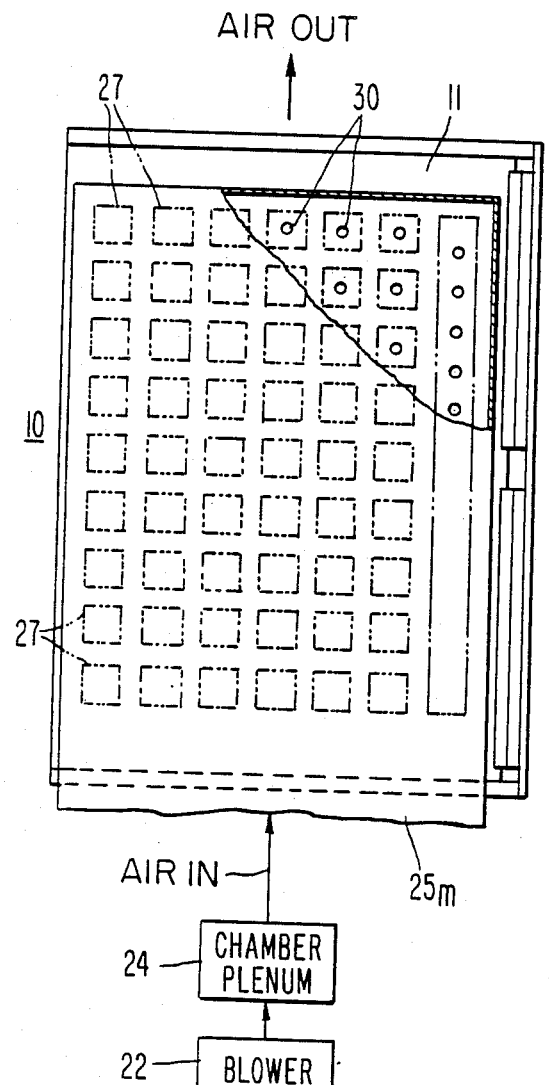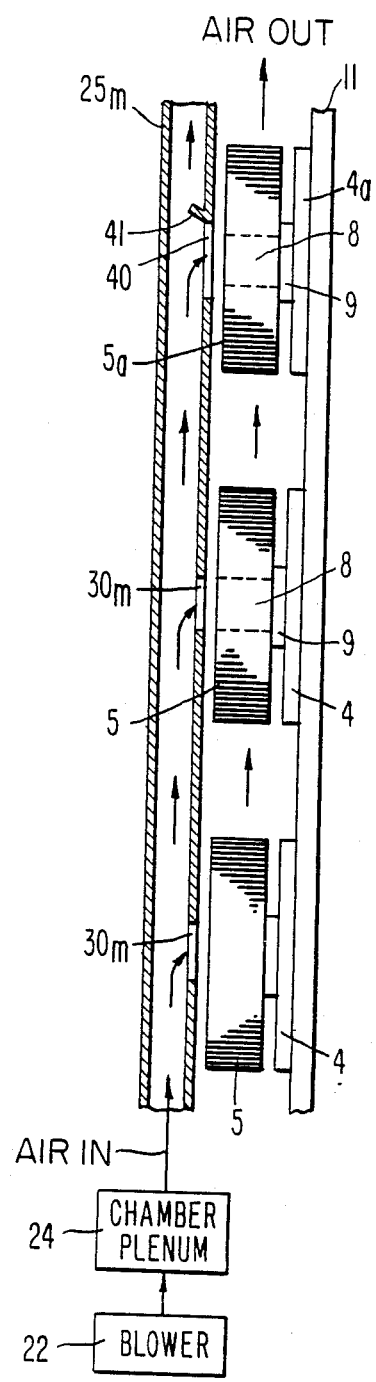

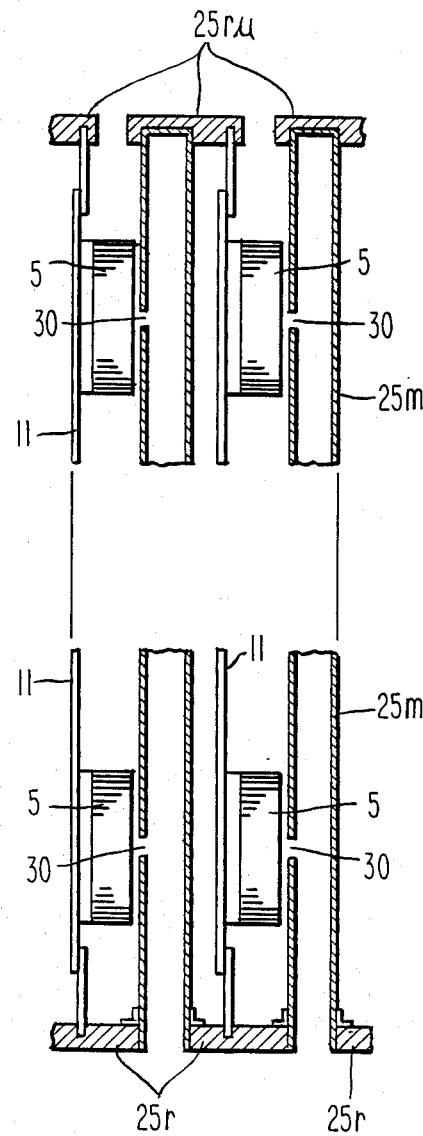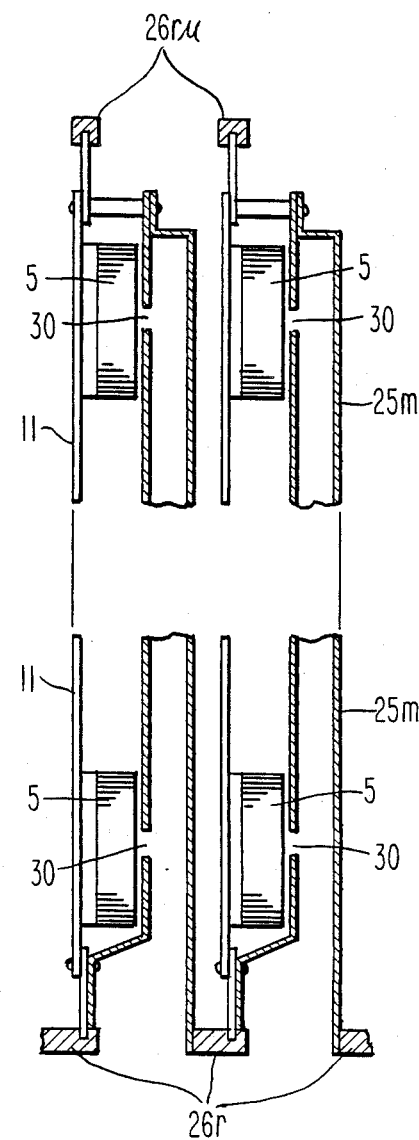

DIRECTED AIR MANAGEMENT SYSTEM FOR COOLING MULTIPLE HEAT SINKS

This is a continuation-in-part of co-pending application Ser. No. 023,359 filed on Mar. 9, 1987.

FIELD OF THE INVENTION

This disclosure relates methods and means for directing controlled amounts of airflow to selected portions of printed (PC) circuit boards holding multiple numbers of heat sinks.

CROSS-REFERENCE TO RELATED APPLICATION

This disclosure can be related to a co-pending application entitled "Staggered Radial Fin Heat Sink Device for Integrated Circuit Package," U.S. Ser. No. 880,427, inventor Paul G. Gabuzda, which discloses heat sinks having central apertures for receiving impinging airflows. This application issued as U.S. Pat. No. 4,715,438 on Dec. 29, 1987. A notice of allowance was received on Sept. 24, 1987 for this patent application.

BACKGROUND OF THE INVENTION

With the rapid trend of packaging of printed circuit boards holding pin grid arrays and other components in smaller, tighter and more condensed spaces, it becomes a considerable problem as to how to effectuate cooling means to the printed circuit boards and their components in the most efficient manner.

It is well known that not all pin grid arrays (PGA) and printed circuit components are uniformly heated at an even rate over the extent of the printed circuit board. Rather, as is the normal case, certain areas of the printed circuit board with its mounted components generate higher elements of heat than others and thus require specialized cooling treatment for those particular areas.

Heretofore, cooling methods for directing cooling air across printed circuit boards were directed to standard pressure blowing a stream of air between printed circuit boards parallel to the board, known as "serial cooling," or impinging indiscriminately directly over printed circuit board components. The advantage of the latter (impingement) over the former (serial cooling) is the avoidance of two deleterious thermal effects: passage of heat generated by one component to a neighboring component, and blockage of airflow to some components by adjacent components. No provision has ever been devised for adjusting, regulating and directing the flow of cooling air to selected portions and areas of the printed circuit board which require higher rates of cooling efficiency, resulting in superior thermal management and therefore system reliability.

SUMMARY OF THE INVENTION

The present disclosures involves a Directed Air Management System (DAMS) whereby cooling air is not merely directed over the surface of printed circuit boards, but rather is selectively channelled and regulated at different portions of the printed circuit board such that those areas which need extensively greater cooling capacity can be efficiently granted the extra needed cooling flow required to cool the particular area.

Thus, the present invention provides a system using a "mini-plenum" which is sectored into various areas over the printed circuit board, one mini-plenum per board, and whereby each of the sectored areas is provided with a different size orifice which will be reflective of the cooling needs of that particular sector. A sector may comprise a single pin-grid array device, preferably with a "radial fin heat sink". Orifices may be located on one or both sides of the mini-plenum.

Additionally, not only the selected orifice size can be provided but also extension foils adjacent the orifice can be provided with a particular size and angular adjustment so as to deflect and divert the proper amount of cooling air into the orifice.

In this way, a mini-plenum of unique orifice pattern is specified for each printed circuit board design. The mini-plenums, similar in size to boards, can be inserted or extracted like the boards. Alternately, the mini-plenums may be physically attached to printed circuit boards such that the mini-plenums and boards are inserted or extracted concurrently.

In consequence of the thermal management system described herein, higher printed circuit board power densities can be tolerated, or alternately higher reliability can be achieved, in systems populated with pin-grid arrays of various power dissipations bearing "radial fin heat sinks", with a minimum of additional cooling infrastructure expense and with a maximum of printed circuit board design flexibility.

BRIEF DESCRIPTION OF THE DRAWINGS

FIG. 1 is a drawing of the overall directed air management system for directing cooling air through orifices centered over heat sinks on a printed circuit board;

FIG. 2 is a top plan view of the system showing how the orifices are centered over the heat sinks and pin grid arrays;

FIG. 3 is a side view of the air carrying mini-plenum which locates over the printed circuit board;

FIG. 4B shows a mechanical insertion/withdrawal arrangement whereby the mini-plenum is not attached to the printed circuit board and either the mini-plenum or the printed circuit board can be individually withdrawn or inserted without influencing the other unit;

FIG. 4C illustrates a mechanical arrangement whereby the mini-plenum and the printed circuit board are connected together in a combined unit which can be inserted or withdrawn from a digital module while continuing the combined unity of the printed circuit board and the mini-plenum.

DESCRIPTION OF PREFERRED EMBODIMENT

Figure 4A:
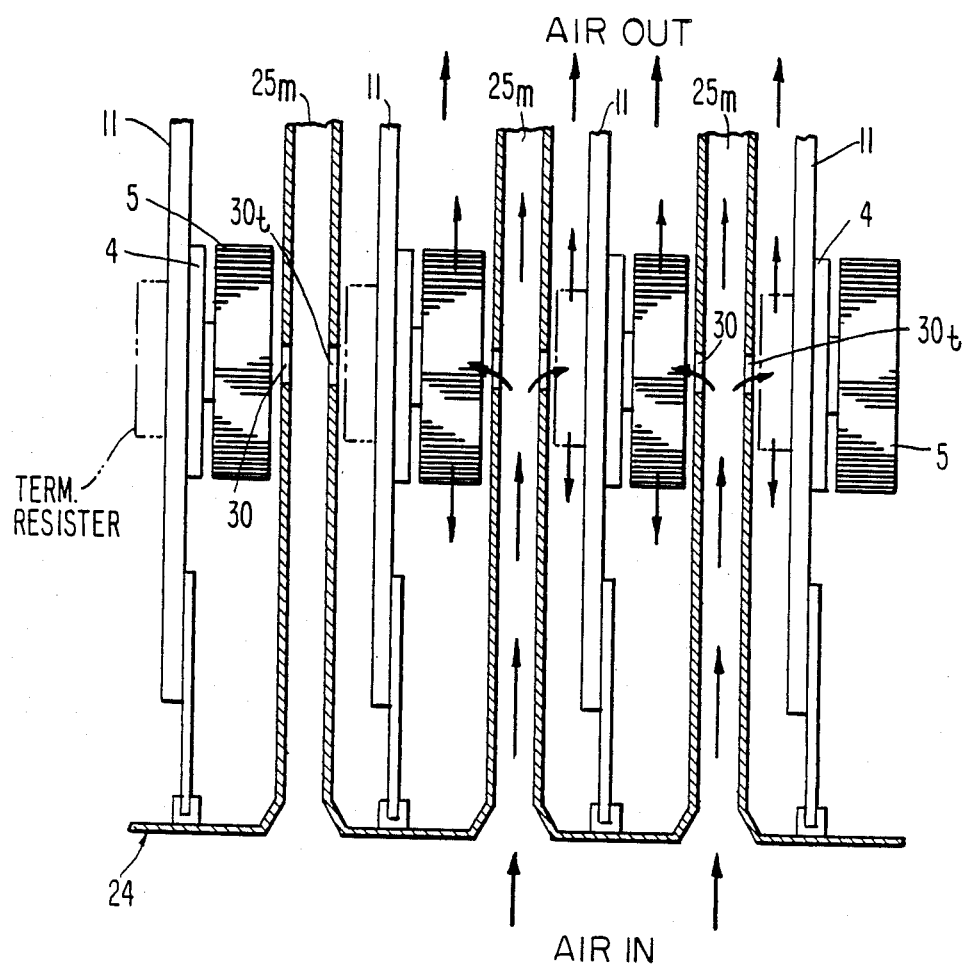
FIG. 4A is a drawing showing how the mini-plenum inserts between a parallel series of printed circuit (PC) boards to cool both the "component" side of one PC board at the same time cooling the "solder" side of the adjacent PC board.

Referring to FIG. 1, there is seen the directed air management system apparatus 10. The apparatus consists of a number of components whereby a printed circuit board 11 is carrying heat sink devices shown as $5_a$, $5_b$, etc. throughout the planar area of the printed circuit board.

Placed over each of the heat sink areas of the printed circuit board is a "mini-plenum" (a small, thin air plenum) 25 having a designated locality area 27 wherein each of the designated locality areas has, on either of its sides, an orifice 30 of a suitable diameter and placement for directing airflow over and onto a particular area of the printed circuit board having a heat sink 5.

Since no placement restrictions for pin-grid arrays or other components are applied to printed circuit board designers, the orifices are sized and placed to optimize cooling of any particular board design, such that a jet of air at ambient temperature impinges on each heat sink or locality.

The direct air management system cooling apparatus is provided with a centrifugal blower 22 and an air filter 23 by which incoming air can be pressurized and pushed through a plenum 24 (air chamber and diffuser) into the mini-plenums 25.

Figure 5:
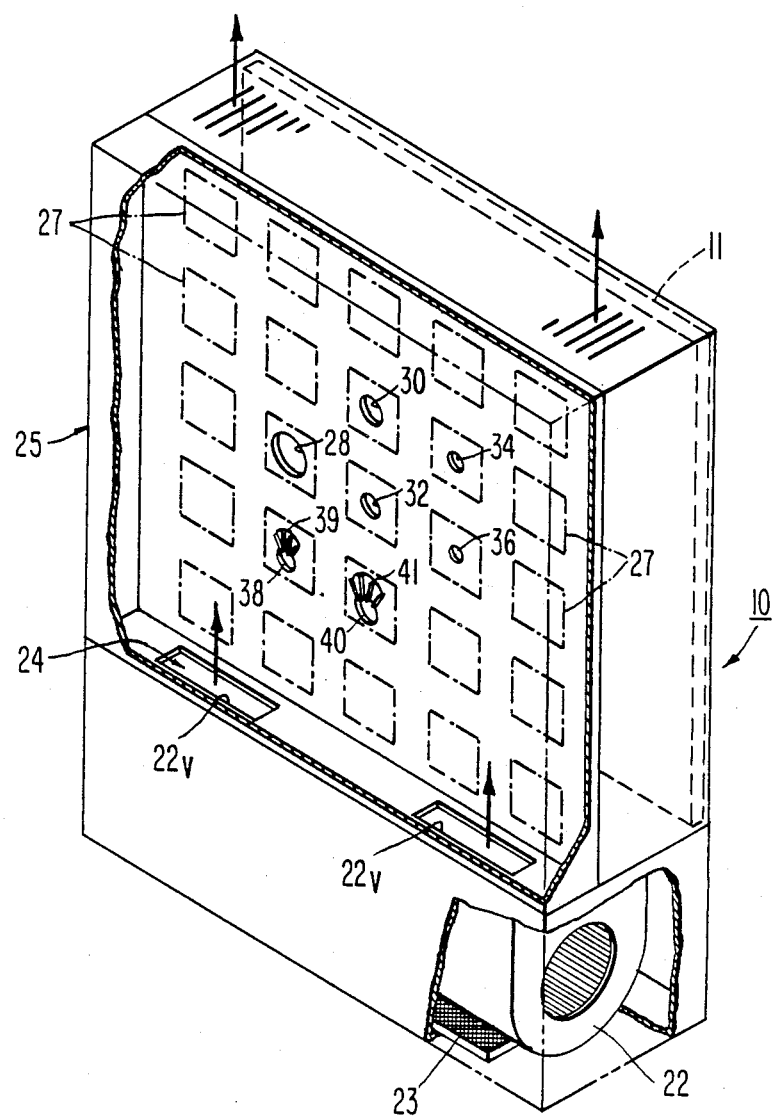
FIG. 5 is a schematic drawing showing how variable size air foils or dams can be used to direct adjustable flows of air into the orifices.

The air which is pressed into the air chamber plenum 24 then moves across the surface of the mini-plenum 25 whereby it can then exit out through various sizes of orifices in flexible locations shown as orifices 28, 30, 32, 34 and 36. As seen in FIG. 1 and FIG. 5, these orifices are selectively chosen to be of different diameter in order to permit lesser or greater amounts of airflow therethrough. Thus orifice 28 is of a large size while orifice 36 is of a very small size and orifices such as 30, 32 and 34 are of a medium size opening. Thus depending on the size of the orifice opening and the amount of air pressure developed by the fan, there will be varying amounts of airflow impinging through the orifices onto each selected heat sink area 5 on the printed circuit board 11. Thus varying amounts of cooling air can be selectively dispensed to different areas according to the needs of that particular area.

Additionally, as shown in FIG. 5 on orifice 38 and 40, there can also be provided interference-air foils shown as 39 and 41 which can also be used to divert and regulate the amount of air which is swept into a particular orifice.

Thus, for any particular designed type of printed circuit board having different cooling requirements in different areas of the printed circuit board, it can readily be seen how the mini-plenums of the Directed Air Management System can be set for an optimally desired adjustment for each area of the printed circuit board in order to provide an adequate and safe amount of cooling impingement rather than simply providing a generalized flow of air over the entire system.

FIGS. 2 and 3 show a top plan view of the Directed Air Management System in schematic form and also the side or cross-sectional view of the system as it directs individualized amounts of impinging air onto each heat sink.

Thus referring to FIG. 2, there is seen the air blower 22 which develops pressurized air into air chamber plenum 24 which conveys the air into the elongated mini-plenum channel $25_m$ wherein the air is passed across the locality areas 27 (or specifically selected pin-grid arrays) of the mini-plenum $25_m$ in order to exhaust at the top of the printed circuit board. As further seen in the cutaway portion of FIG. 2, each of the locality areas 27 is provided with an orifice such as 30 whereby the amount of air permitted to impinge to a particular area is controlled by the size of the orifice. Additionally as seen in FIG. 5, each orifice may be provided with an air-foil or dam (as elements 39, 41) to further control the volume of air directed into the orifices such as orifice 38 or 40.

Now referring to the cross-sectional view of FIG. 3, there is seen the air chamber plenum 24 feeding air into the mini-plenum $25_m$ whereby the airflow flows across the orifices such as $30_m$ and enters the orifice to provide cooling air according to the diameter or opening size of the orifice, and according to the size and shape of any air foils, as foil 41, placed around a given orifice.

In FIG. 3 the grid pin array (PGA) 4 is shown covered by a heat sink 5 having a central opening 8 which is in alignment with the orifice of the plenum so that the air is directed forthrightly into the central opening 28 of the heat sink 5.

As will be noted with the pin grid array designated $4_a$ which has a heat sink designated $5_a$, the orifice 40 is provided with a wind-foil or tab 41 which can be used to adjust the amount of cooling air to be diverted into the orifice 40 for providing cooling air to the heat sing $5_a$. A heat conductive slug 9 (attached to the pin grid array) connects the radial finned heat sink $5_a$ to the pin grid array $4_a$.

In FIG. 4A there is seen a configuration of the mini-plenum whereby the mini-plenum $25_m$ conducts air and has an orifice 30 on one side and a second orifice $30_t$ on the opposite side. Thus as seen in FIG. 4, the impinging airflow can be exited in two directions, that is to say through the orifice 30 onto the heat sink 5 and additionally through the orifice $30_t$ onto various components such as terminating resistors which may reside on the solder side of the printed circuit board. Thus, a dual function is provided in this case in that the mini-plenum can selectively provide the impingement of cooling air both onto the "component side" where heat sinks are provided for pin grid arrays, and additionally at the same time, provide impinging air for the "solder" or connection side of the adjacent printed circuit board in order to further cool that area. FIG. 4B illustrates how the mini-plenums $25_m$ can be inserted and/or removed from the upper ($25_{ru}$) and lower ($25_{rl}$) runners in a digital module. This represents the arrangement where the mini-plenums $25_m$ are not attached to the printed circuit boards 11 and may be removed or inserted independently of the printed circuit board. FIG. 4C illustrates how a combination of the mini-plenum $25_m$ and the printed circuit board 11 can be configured together for insertion and withdrawal of a unified plenum-board unit which combines together the plenum and the board. A set of upper ($26_{ru}$) and lower ($26_{rl}$) runners support the combined plenum-printed circuit board unit which can slide into or out of a digital module. These figures are illustrative of one type of mechanical method of effectuating the directed air management system in an efficient mechanical implementation.

The Directed Air Management System (DAMS) employs the "mini-plenum" $25_m$ which is connected to the conventional plenum 24 in order to convey pressurized air to any location in the circuit card, with each card having an associated mini-plenum.

As previously described, an orifice of any particular chosen diameter size may be placed at any selected location or "locality area" proximate to the associated PC board. This makes is possible that components of differing power dissipation are not restricted in placement in their positions on the printed circuit board and additionally their junction temperatures may thus be carefully and selectively controlled to improve reliability. Also, a minimum of airflow may be apportioned for the maximization of system reliability.

It should be understood that reliability depends not only on the average device temperature but also on the distribution of temperatures throughout the system. Thus, the system provides a selectively chosen amount of cooling air to be directed to those areas most needed rather than using the conventional "serial flow" which merely provides the same amount of cooling air over the entire printed circuit board. Thus it is possible to control the average junction temperature and also the variance of junction temperatures in the various heat sinks involved, and in certain portions of the PC board and its mounted components.

Compared with conventional serial airflow, the Directed Air Management System can accommodate higher circuit board power densities while using a smaller quantity of airflow, accomplishing this in part by the elimination of temperature "stack rise" and aerodynamic shadowing effects. However, the Directed Air Management System does require that the blower provide a somewhat greater level of driving pressure to effect the necessary airflow.

Coincidentally with the use of the mini-plenum there have been developed unique types of heat sinks which can be placed in alignment with the air flow and can receive the impinging air for particularly great efficiency in this impingement environment. These types of heat sinks are called staggered radial fin heat sink devices as described in a copending U.S. Patent application entitled "Staggered Radial Fin Heat Sink Device for IC Package", inventors Paul G. Gabuzda and Sanford V. Terrell, and filed in the U.S. Patent Office on June 30, 1986 as U.S. Ser. No. 880,427. In these radial fin heat sinks, there are equally spaced fins of differing lengths placed in the radial direction and joined together on a spreader plate. A central opening or orifice alignment area in the heat sink is capable of being lined up directly across from the orifice of the mini-plenum so as to receive the direct impingement of cooling air.

There has been described herein a Directed Air Management System whereby a major plenum for pressurized air is connected to a mini-plenum which conducts air between the interstices or gap areas between adjacent printed circuit boards. The mini-plenum has designated locality areas which are directly positioned over particular sections of the printed circuit board and whereby an orifice can be selected of sufficient size so as to provide the sufficient and optimal amount of cooling air required for a particular section on the printed circuit board. Additionally, an air-foil or tab can be provided adjacent the orifice in order to deflect particular amounts of cooling air into the particular orifice. The mini-plenum can also be arranged to dispense air in "two directions" so that the components side of one printed circuit board is provided with cooling air while at the same time the solder or connection side of the adjacent printed board is also provided with cooling air. A unique configuration of holes may be specified for each printed circuit board design, and mini-plenums may be inserted or extracted much like cards. Alternatively, the mini-plenums may be physically attached to the cards.

While the above preferred embodiment has shown a particular configuration of the invention, it is to be understood that this disclosed concept may be effectuated in a number of equivalent ways and is to be considered as defined by the following claims.

What is claimed is:

1. A directed air management system apparatus for the cooling of a plurality of printed circuit boards stacked in a digital module, said apparatus comprising, in combination:
   (a) a plurality of parallel stacked printed circuit boards slideably connected into said digital module and wherein each printed circuit board carries a plurality of pin grid arrays over which are mounted individual sets of radial fin heat sinks, and wherein each of said printed circuit boards is juxtaposed to an adjacent air-channeling mini-plenum which covers the entire surface of each of said printed circuit boards;
   (b) a plurality of air-channeling mini-plenums, each mini-plenum located between adjacent printed circuit boards, wherein each of said air-channeling mini-plenums includes:
      (b1) an input vent for pressurized air intake and one or more output orifices for venting air;
      (b2) a longitudinal extension chamber juxtaposed to said printed circuit board and which covers the adjacent surface of said printed circuit board, said longitudinal extension chamber forming an air-channeling mini-plenum connected to receive pressurized inflowing air and wherein said longitudinal extension chamber includes:
         (b2a) a base surface area contiguous to said heat sinks and parallel to said printed circuit board and forming a base plane having localized surface areas which correlate to the positions of said heat sinks on said printed circuit board;
         (b2b) and wherein each of said localized surface areas includes an orifice opening for providing airflow to an adjacent heat sink wherein each of said orifice openings is customized and selectively controlled in diameter of opening in order to regulate the appropriate amount of air flowing therethrough to accommodate the needful cooling requirements of the adjacent heat sink device.

2. An air management system for a digital cabinet module which concatenates a plurality of parallel printed circuit boards, having an underside and a component side, with a plurality of justaposed mini-plenum means in alternating positions, said system for regulating the amount of impinging and cooling airflow over selected portions of each of said printed circuit boards, said system comprising:
   (a) a thin longitudinal air chamber mini-plenum means situated adjacent and parallel to each printed circuit board; said air chamber mini-plenum means having anterior and posterior walls residing between each printed circuit board and its adjacent printed circuit board, and wherein each said air chamber mini-plenum means is provided with orifice openings on said anterior and posterior walls in order to provide cooling air to cool said printed circuit boards, on both the said component side and said underside, said anterior and posterior walls each including:
      (a1) a plurality of localized sub-areas where each sub-area is associated with a particular portion of the adjacent printed circuit board and wherein each of said localized sub-areas is provided with an orifice of appropriate diameter in order to regulate the amount of cooling air passing therethrough, thus customizing said cooling airflow to match the particular cooling needs of each said portion of each of said printed circuit boards;
   (b) means for directing pressurized airflow into said air chamber mini-plenum means;
   (c) said plurality of printed circuit boards arranged in parallel alternating alignment with said air chamber mini-plenum means such that said anterior wall orifice openings cool said underside of a leftside adjacent printed circuit board while said posterior wall orifice openings cool the component side of the rightside adjacent printed circuit board.

* * * * *